United States Patent
Yuan et al.

(10) Patent No.: US 10,151,807 B2
(45) Date of Patent: Dec. 11, 2018

(54) MAGNETIC FIELD SENSING APPARATUS WITH ANISOTROPIC MAGNETO-RESISTIVE RESISTORS AND DETECTION METHOD THEREOF

(71) Applicants: Fu-Te Yuan, New Taipei (TW);
Pei-Chun Kao, New Taipei (TW);
Meng-Huang Lai, New Taipei (TW)

(72) Inventors: Fu-Te Yuan, New Taipei (TW);
Pei-Chun Kao, New Taipei (TW);
Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 46 days.

(21) Appl. No.: 15/361,082

(22) Filed: Nov. 25, 2016

(65) Prior Publication Data

US 2017/0153302 A1 Jun. 1, 2017

Related U.S. Application Data

(60) Provisional application No. 62/260,344, filed on Nov. 27, 2015.

(30) Foreign Application Priority Data

Oct. 6, 2016 (TW) .............................. 105132309 A

(51) Int. Cl.
*G01R 33/09* (2006.01)
*G01R 33/00* (2006.01)

(52) U.S. Cl.
CPC ....... *G01R 33/096* (2013.01); *G01R 33/0023* (2013.01)

(58) Field of Classification Search
CPC .... G01R 33/06; G01R 33/063; G01R 33/066; G01R 33/07; G01R 33/072; G01R 33/075;
(Continued)

(56) References Cited

U.S. PATENT DOCUMENTS 5,945,825 A * 8/1999 Clemens ............. G01R 33/093
324/252
8,525,514 B2 9/2013 Cai et al.
(Continued)

FOREIGN PATENT DOCUMENTS

CN 1879006 12/2006
TW 200405023 4/2004
(Continued)

*Primary Examiner* — David M. Schindler
(74) *Attorney, Agent, or Firm* — JCIPRNET

(57) ABSTRACT

A magnetic field sensing apparatus and a detection method thereof are provided. The magnetic field sensing apparatus includes first and second AMR resistors, a current generator, and an arithmetic device. A magnetized direction of the first AMR resistor is set as a first direction. A magnetized direction of the second AMR resistor is set as a second direction opposite to or the same as the first direction. The current generator provides a current in a direction parallel to the first direction to flow through the first and second AMR resistors. The arithmetic device obtains a first detection voltage according to a voltage difference between two terminals of the first AMR resistor, obtains a second detection voltage according to a voltage difference between two terminals of the second AMR resistor, and performs his an arithmetic operation on the first and second detection voltages to obtain a first magnetic field detection result.

17 Claims, 5 Drawing Sheets

(58) Field of Classification Search
CPC .... G01R 33/077; G01R 33/09; G01R 33/091; G01R 33/093; G01R 33/095; G01R 33/096; G01R 33/098; G01B 7/14; G01B 7/30; G01D 5/142; G01D 5/145
See application file for complete search history.

(56) References Cited

U.S. PATENT DOCUMENTS

| | | | |
|---|---|---|---|
| 2003/0117254 A1* | 6/2003 | Wan | B82Y 25/00 338/32 R |
| 2013/0021943 A1* | 1/2013 | Lu | H04L 45/023 370/254 |
| 2017/0184691 A1* | 6/2017 | Yuan | G01R 33/096 |

FOREIGN PATENT DOCUMENTS

| | | |
|---|---|---|
| TW | 201437659 | 10/2014 |
| TW | I482984 | 5/2015 |
| WO | 2013085547 | 6/2013 |
| WO | 2015146593 | 10/2015 |

* cited by examiner

MAGNETIC FIELD SENSING APPARATUS WITH ANISOTROPIC MAGNETO-RESISTIVE RESISTORS AND DETECTION METHOD THEREOF

CROSS-REFERENCE TO RELATED APPLICATION

This application claims the priority benefits of U.S. provisional application Ser. No. 62/260,344, filed on Nov. 27, 2015, and Taiwan application serial no. 105132309, filed on Oct. 6, 2016. The entirety of each of the above-mentioned patent applications is hereby incorporated by reference herein and made a part of this specification.

FIELD OF THE INVENTION

The invention relates to a magnetic field sensing apparatus and a detection method; more particularly, the invention relates to a magnetic field sensing apparatus constituted by anisotropic magneto-resistive (AMR) resistors and a detection method.

DESCRIPTION OF RELATED ART

With the popularity of portable electronic apparatus, electronic compasses capable of sensing the direction of the earth's magnetic field have drawn more and more attention. When the electronic compasses are applied to small portable electronic apparatuses (e.g., smart phones), the electronic compasses are not only required to have small volume but also able to perform the 3-axis sensing function, for users may hold the phones with their hands in an inclined manner and at various different angles. The electronic compasses may also be applied to drones, such as remote controlled planes, remote controlled helicopters, and so on.

According to the related art, anisotropic magneto-resistive (AMR) resistors are frequently used to sense the magnetic field through the Wheatstone bridge. In case of the Wheatstone full bridge configuration, four AMR resistors are required for sensing the magnetic field. That is, the conventional magnetic field sensing apparatus often requires large layout area, which leads to the increase in the production costs.

SUMMARY OF THE INVENTION

The invention provides a magnetic field sensing apparatus and a detection method thereof for effectively improving the accuracy of sensing the magnetic field and reducing relevant costs, and the magnetic field sensing apparatus can have the reduced volume.

In an embodiment of the invention, a magnetic field sensing apparatus that includes a first anisotropic magneto-resistive (AMR) resistor, a second AMR resistor, a current generator, and an arithmetic device is provided. A magnetized direction of the first AMR resistor is set to be a first direction. A magnetized direction of the second AMR resistor is set to be a second direction opposite to or the same as the first direction. When a resistance of the first AMR resistor increases according to a tested magnetic field, a resistance of the second AMR resistor correspondingly decreases, and when the resistance of the first AMR resistor decreases according to the tested magnetic field, the resistance of the second AMR resistor correspondingly increases. The current generator are coupled to the first and second AMR resistors. The current generator provides a current in a direction parallel to the first direction to flow through the first and second AMR resistors. The arithmetic device is coupled to the first AMR resistor, the second AMR resistor, and the current generator. The arithmetic device obtains a first detection voltage according to a voltage difference between two terminals of the first AMR resistor, obtains a second detection voltage according to a voltage difference between two terminals of the second AMR resistor, and performs an arithmetic operation on the first and second detection voltages to obtain a first magnetic field detection result.

According to an embodiment of the invention, the arithmetic device includes a first operational amplifier, a second operational amplifier, and an arithmetic operation device. A first input terminal of the first operational amplifier is coupled to a first terminal of the two terminals of the first AMR resistor, a second terminal of the first operational amplifier is coupled to a second terminal of the two terminals of the first AMR resistor and a reference ground terminal, and an output terminal of the first operational amplifier generates the first detection voltage. A first input terminal of the second operational amplifier is coupled to a first terminal of the two terminals of the second AMR resistor, a second terminal of the second operational amplifier is coupled to a second terminal of the two terminals of the second AMR resistor and the reference ground terminal, and an output terminal of the second operational amplifier generates the second detection voltage. The arithmetic operation device is coupled to the output terminal of the first operational amplifier and the output terminal of the second operational amplifier, such that the first detection voltage and the second detection voltage are applied to perform the arithmetic operation and obtain the first magnetic field detection result.

According to an embodiment of the invention, the arithmetic operation device is a subtractor, and the arithmetic operation is a subtraction operation.

According to an embodiment of the invention, the current generator includes a first current source and a second current source. The first current source is coupled to the first terminal of the first AMR resistor and provides a first current in the direction parallel to the first direction to flow through the first AMR resistor. The second current source is coupled to the first terminal of the second AMR resistor and provides a second current in the direction parallel to the first direction to flow through the second AMR resistor.

According to an embodiment of the invention, the arithmetic device includes a first operational amplifier, a second operational amplifier, and an arithmetic operation device. A first input terminal of the first operational amplifier is coupled to a first terminal of the two terminals of the first AMR resistor, a second terminal of the first operational amplifier is coupled to a second terminal of the two terminals of the first AMR resistor and a first terminal of the two terminals of the second AMR resistor, and an output terminal of the first operational amplifier generates the first detection voltage. A first input terminal of the second operational amplifier is coupled to a first terminal of the two terminals of the second AMR resistor, a second terminal of the second operational amplifier is coupled to a second terminal of the two terminals of the second AMR resistor and the reference ground terminal, and an output terminal of the second operational amplifier generates the second detection voltage. The arithmetic operation device is coupled to the output terminal of the first operational amplifier and the output terminal of the second operational amplifier, such that the first detection voltage and the second detection voltage are applied to perform the arithmetic operation and obtain the first magnetic field detection result.

According to an embodiment of the invention, the current generator provides a first current to the first terminal of the first AMR resistor and enables the first current to sequentially flow through the first and second AMR resistors in the direction parallel to the first direction.

According to an embodiment of the invention, after the first magnetic field detection result is generated, the magnetized direction of the first AMR resistor is converted into an opposite direction of the first direction, the magnetized direction of the second AMR resistor is converted into an opposite direction of the second direction, and the arithmetic device further obtains a third detection voltage according to the voltage difference between the two terminals of the first AMR resistor, obtains a fourth detection voltage according to the voltage difference between the two terminals of the second AMR resistor, and performs an arithmetic operation on the third and fourth detection voltages to obtain a second magnetic field detection result.

According to an embodiment of the invention, the arithmetic device further performs the arithmetic operation on the first and second magnetic field detection results to obtain a third magnetic field detection result.

According to an embodiment of the invention, the first AMR resistor and the second AMR resistor are located on the same substrate.

According to an embodiment of the invention, each of the first and second AMR resistors includes a ferromagnetic bar. The ferromagnetic bar includes a plurality of serially connected electrical shorting bars, and each of the electrical shorting bars has a conical end point.

According to an embodiment of the invention, the magnetic field sensing apparatus further includes a plurality of magnetized direction setting devices respectively located around the first AMR resistor and the second AMR resistor. The magnetized direction setting devices are configured to respectively set up the magnetized directions of the first AMR resistor and the second AMR resistor.

In an embodiment of the invention, a magnetic field detection method includes: providing a first AMR resistor and setting a magnetized direction of the first AMR resistor to be a first direction; providing a second AMR resistor and setting a magnetized direction of the second AMR resistor to be a second direction opposite to or the same as the first direction, wherein when a resistance of the first AMR resistor increases according to a tested magnetic field, a resistance of the second AMR resistor correspondingly decreases, and when the resistance of the first AMR resistor decreases according to another tested magnetic field, the resistance of the second AMR resistor correspondingly increases; providing a current in a direction parallel to the first direction to flow through the first and second AMR resistors; respectively obtaining a first detection voltage according to a voltage difference between two terminals of the first AMR resistor and obtaining a second detection voltage according to a voltage difference between two terminals of the second AMR resistor; performing an arithmetic operation on the first and second detection voltages to obtain a first magnetic field detection result.

In view of the above, the first and second AMR resistors having the same magnetized direction or opposite magnetized directions are applied to sense the magnetic field. When the resistance of the first AMR resistor increases according to a tested magnetic field, a resistance of the second AMR resistor correspondingly decreases, and when the resistance of the first AMR resistor decreases according to the tested magnetic field, the resistance of the second AMR resistor correspondingly increases. In an embodiment of the invention, two AMR resistors are required to complete the magnetic field sensing action, thus effectively reducing the circuit layout area of the magnetic field sensing apparatus as well as the production costs. Besides, according to an embodiment of the invention, the arithmetic operation is performed according to the detection voltages generated by the AMR resistors whose resistances are varied in different manner, so as to remove the system offset impact, lessen the influence of skew electrical parameters caused by ambient noise and temperature changes, and effectively improve accuracy of sensing the magnetic field.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
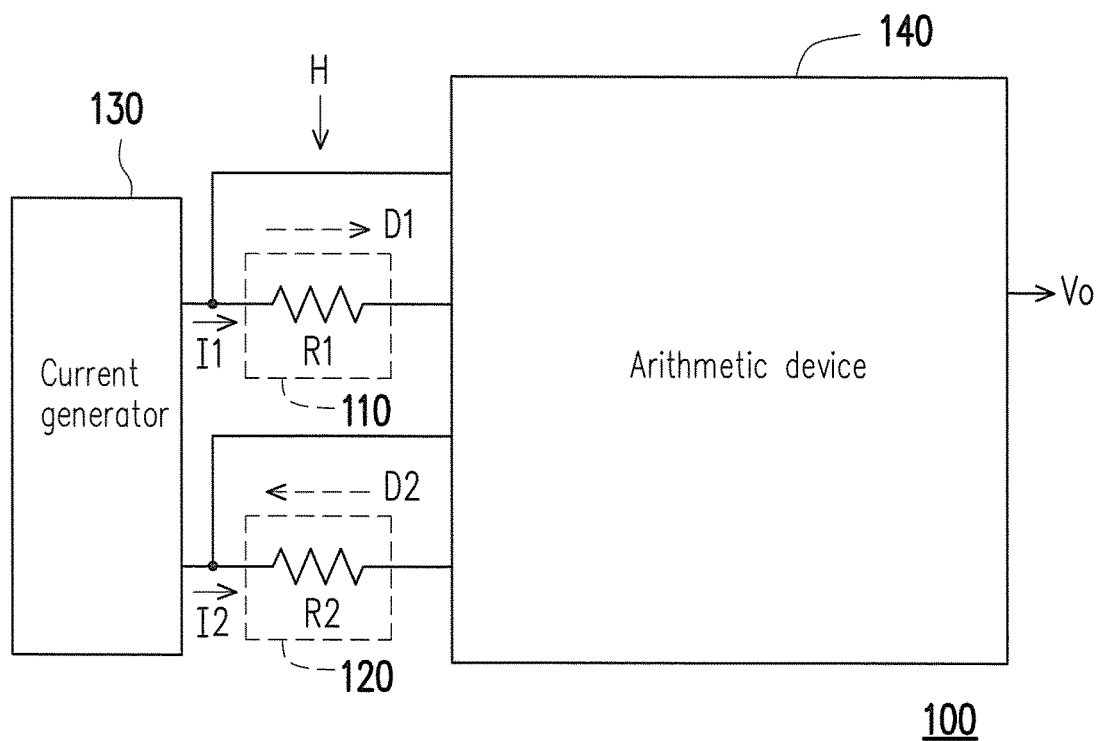
FIG. 1 is a schematic diagram illustrating a magnetic field sensing apparatus according to an embodiment of the invention.

Please refer to FIG. 1, which is a schematic diagram illustrating a magnetic field sensing apparatus according to an embodiment of the invention. The magnetic field sensing apparatus 100 includes anisotropic magneto-resistive (AMR) resistors 110 and 120, a current generator 130, and an arithmetic device 140. The AMR resistor 110 is serially connected between the current generator 130 and the arithmetic device 140. During an initial time period before the magnetic field sensing apparatus 100 senses the magnetic field, a magnetized direction of the AMR resistor 110 can be set as a direction D1. The AMR resistor 120 is serially connected between the current generator 130 and the arithmetic device 140. During the initial time period before the magnetic field sensing apparatus 100 senses the magnetic field, a magnetized direction of the AMR resistor 120 can be set as a direction D2 that is opposite to the direction D1.

The AMR resistors 110 and 120 respectively provide resistances R1 and R2. If the AMR resistors 110 and 120 are not subject to the impact of the external magnetic field, the resistances R1 and R2 respectively provided by the AMR resistors R1 and R2 may be the same. The magnetized directions of the AMR resistors 110 and 120 are set to be opposite to each other. If the AMR resistors 110 and 120 are subject to the impact of the external magnetic field, the variation tendency of the resistance R1 provided by the AMR resistor 110 is opposite to the variation tendency of the resistance R2 provided by the AMR resistor 120. Specifically, if the resistance R1 provided by the AMR resistor 110 increases due to the impact of the external magnetic field, the resistance R2 provided by the AMR resistor R2 correspondingly decreases. By contrast, if the resistance R1 provided by the AMR resistor 110 decreases due to the impact of the external magnetic field, the resistance R2 provided by the AMR resistor 120 correspondingly increases.

The current generator 130 provides a current I1 in the direction D1 to flow through the AMR resistor 110 and provides a current I2 in a direction parallel to the direction D1 to flow through the AMR resistor 120. The arithmetic device 140 is coupled to two terminals of the AMR resistor 110 and two terminals of the AMR resistor 120. The arithmetic device 140 obtains a first detection voltage according to a voltage difference between the two terminals of the AMR resistor 110, obtains a second detection voltage according to a voltage difference between the two terminals of the AMR resistor 120, and performs an arithmetic operation on the first and second detection voltages to obtain a first magnetic field detection result Vo.

As to the detailed actions of sensing the magnetic field, when the magnetic field sensing apparatus 100 senses the magnetic field, the resistances R1 and R2 provided by the AMR resistors 110 and 120 vary in response to the magnetic field component of the tested magnetic field in a direction H, and the direction H is perpendicular to extension directions of the AMR resistors 110 and 120. For instance, if the magnetic field component of the tested magnetic field is not 0, the resistance R1 provided by the AMR resistor 110 may be changed to R+ΔR, and the resistance R2 provided by the AMR resistor 120 may be changed to R−ΔR. Through the currents I1 and I2 provided by the current generator 130, the voltage difference between the two terminals of the AMR resistor 110 may increase in response to the increase in the intensity of the tested magnetic field, and the voltage difference between the two terminals of the AMR resistor 120 may decrease in response to the increase in the intensity of the tested magnetic field. According to the voltage differences between the two terminals of the AMR resistors 110 and 120, the arithmetic device 140 may respectively obtains the first detection voltage and the second detection voltage. The arithmetic device 140 can perform an arithmetic operation (e.g., a subtraction operation) on the first and second detection voltages to obtain the first magnetic field detection result Vo.

As discussed above, if the intensity of the tested magnetic field H gradually increases, the voltage difference between the two terminals of the AMR resistor 110 gradually increases, and the voltage difference between the two terminals of the AMR resistor 120 gradually decreases. Through the comparison between the variation tendencies of the voltage differences between the two terminals of the AMR resistors 110 and 120, the variation tendency of the tested magnetic field can be learned and can be reflected to the first magnetic field detection result Vo.

In the present embodiment, the currents I1 and I2 provided by the current generator 130 may be the same. The current generator 130 may generate the currents I1 and I2 through mirroring a predetermined reference current by a current mirror circuit. Certainly, the above is merely exemplary and should not be construed as a limitation to the invention. Any current generating circuit known to people having ordinary in the pertinent art can be applied to design the current generator 130 provided herein.

According to the present embodiment of the invention, the AMR resistors 110 and 120 are located on the same substrate. The substrate may be made of silicon, glass, or any other material capable of mechanically supporting the magnetic field sensing apparatus 100. In an embodiment of the invention, the sensing apparatus 100 can be arranged on a semiconductor chip and may be formed in the same manner of designing an integrated circuit.

Figure 2:
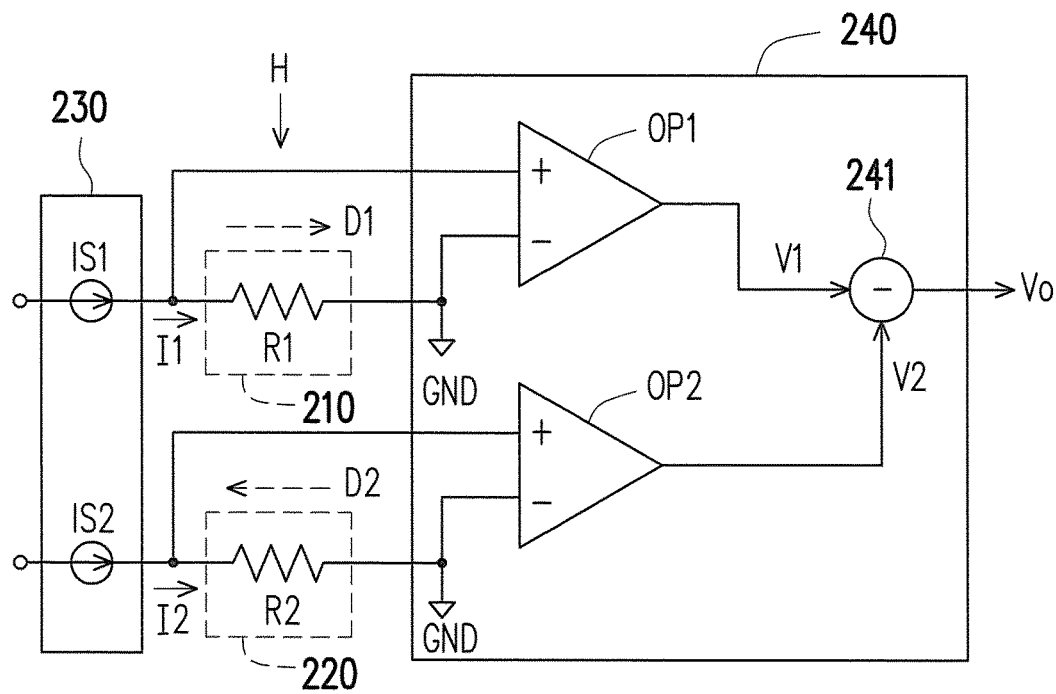
FIG. 2 is a schematic diagram illustrating a magnetic field sensing apparatus according to another embodiment of the invention.

Please refer to FIG. 2, which is a schematic diagram illustrating a magnetic field sensing apparatus according to another embodiment of the invention. The magnetic field sensing apparatus 200 includes AMR resistors 210 and 220, a current generator 230, and an arithmetic device 240. In the present embodiment, the current generator 230 includes current sources IS1 and IS2 respectively providing currents I1 and I2 in the direction D1 to flow toward the AMR resistors 210 and 220. The arithmetic device 240 includes operational amplifiers OP1 and OP2 and an arithmetic operation device 240. Here, a positive input terminal of the operational amplifier OP1 is coupled to the first terminal of the AMR resistor 210, and a negative input terminal of the operational amplifier OP1 is coupled to the second terminal of the AMR resistor 210, so as to detect the voltage differences between the two terminals of the AMR resistor 210. A positive input terminal of the operational amplifier OP2 is coupled to the first terminal of the AMR resistor 220, and a negative input terminal of the operational amplifier OP2 is coupled to the second terminal of the AMR resistor 220, so as to detect the voltage differences between the two terminals of the AMR resistor 220. The negative input terminals of the operational amplifiers OP1 and OP2 are coupled to a reference ground terminal GND.

The arithmetic operation device 241 is coupled to the output terminals of the operational amplifiers OP1 and OP2 and receives the first detection voltage V1 generated by the operational amplifier OP1 and the second detection voltage V2 generated by the operational amplifier O2, and the arithmetic operation device 241 performs a subtraction operation on the first and second detection voltages V1 and V2 to obtain the first magnetic field detection result Vo.

As to the detailed actions of the magnetic field sensing apparatus 200, during the initial time period of sensing the magnetic field, the magnetized directions of the AMR resistors 210 and 220 can be set to be opposite to each other. In the present embodiment, the magnetized direction of the AMR resistor 210 is set as the direction D1, and the magnetized direction of the AMR resistor 220 is set as the direction D2. After the magnetized directions are completely set, the action of setting the magnetized directions can be stopped, and the action of sensing the magnetic field may start.

In response to the tested magnetic field H, the resistances R1 and R2 respectively provided by the AMR resistors 210 and 220 vary in opposite manner. For instance, if the resistance R1 provided by the AMR resistor 210 increases, the resistance R2 provided by the AMR resistor 220 correspondingly decreases; if the resistance R1 provided by the AMR resistor 210 decreases, the resistance R2 provided by the AMR resistor 220 correspondingly increases. It should be mentioned that if the tested magnetic field H is 0, the resistances R1 and R2 respectively provided by the AMR resistors 210 and 220 stay in the initial state.

At this time, the current sources IS1 and IS2 of the current generator 230 respectively provide the currents I1 and I2 in the direction D1 to flow through the AMR resistors 210 and 220. The operational amplifiers OP1 and OP2 respectively receive the voltage differences between the two terminals of the AMR resistors 210 and 220 and amplify the received voltage differences, so as to respectively generate the first detection voltage V1 and the second detection voltage V2. The arithmetic device 241 subtracts the second detection voltage V2 from the first detection voltage V1 to generate the first magnetic field detection result Vo.

Figure 3:
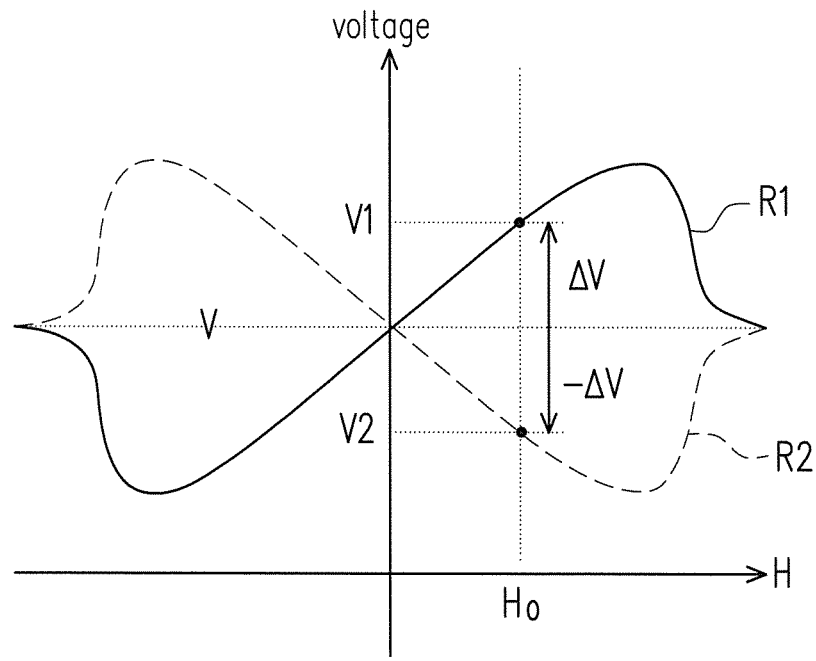
FIG. 3 is a diagram illustrating waveforms of a magnetic field detection result according to an embodiment of the invention.

Please refer to FIG. 2 and FIG. 3. FIG. 3 is a diagram illustrating waveforms of a magnetic field detection result according to an embodiment of the invention. In FIG. 3, the vertical axis is the voltage of the first magnetic field detection result Vo, and the horizontal axis is the intensity of the tested magnetic field H. If the intensity of the tested magnetic field H is within a fixed range, there is linear relationship between the tested magnetic field H and the resistances R1 and R2 respectively provided by the AMR resistor 210 and 220. The resistance R1 is positively correlated to the tested magnetic field H, and the resistance R2 is negatively correlated to the tested magnetic field H.

As shown in FIG. 3, if the tested magnetic field H is equal to H0, the first detection voltage V1 generated by the operational amplifier OP1 is equal to $V+\Delta V$, and the second detection voltage V2 generated by the operational amplifier OP1 is equal to $V-\Delta V$. Here, V is a base voltage generated by the operational amplifiers OP1 and OP2 when the tested magnetic H is equal to 0. The first magnetic field detection result Vo is then obtained by subtracting the second detection voltage V2 from the first detection voltage V1, i.e., $Vo=V+\Delta V-(V-\Delta V)=2\times\Delta V$.

As provided above, the AMR resistors 210 and 220 described in the present embodiment are applied to obtain the first and second detection voltages V1 and V2, and the first magnetic field detection result Vo is generated by subtracting the second detection voltage V2 from the first detection voltage V1. Thereby, the impact of the ambient noise on the magnetic field sensing apparatus 200 can be lessened, and the accuracy of the detection result can be improved.

Figure 4:
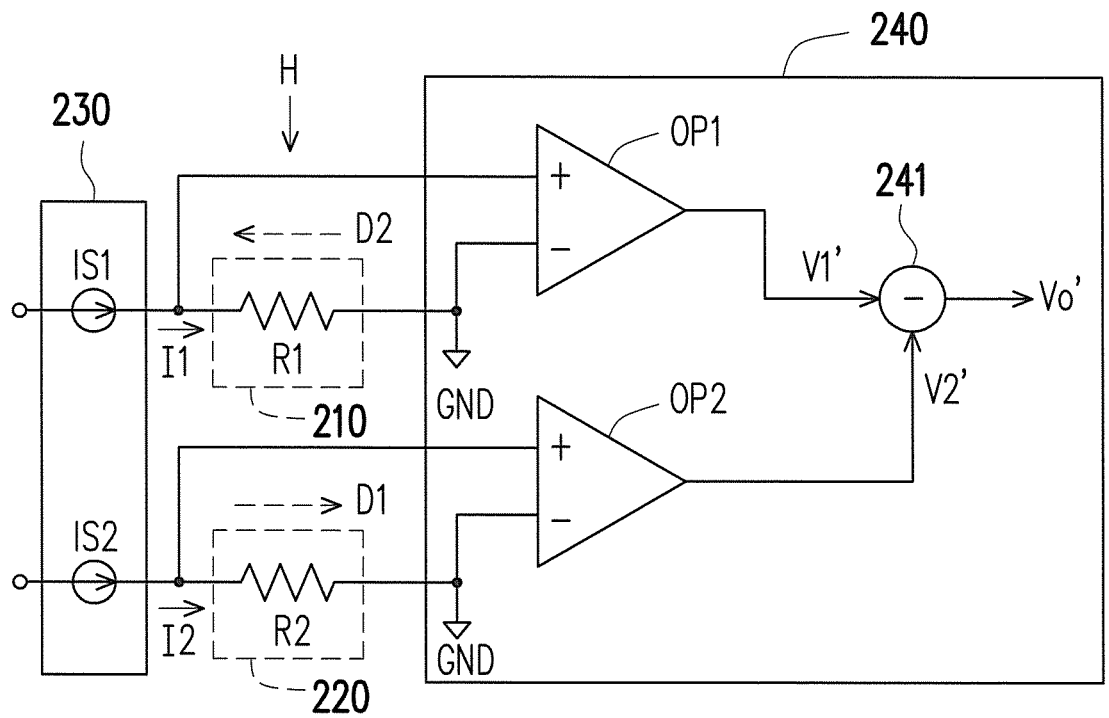
FIG. 4 is a schematic diagram illustrating a motion of a magnetic field sensing apparatus at another sensing stage according to the embodiment depicted in FIG. 2.

Please refer to FIG. 4, which is a schematic diagram illustrating a motion of a magnetic field sensing apparatus at another sensing stage according to the embodiment depicted in FIG. 2. To enhance the accuracy of sensing the magnetic field, the magnetic field is further sensed at another stage, as shown in FIG. 4 and described in the present embodiment, so as to generate the second magnetic field detection result Vo' with the improved accuracy.

As shown in FIG. 4, after the first magnetic field detection result Vo is generated, the magnetized directions of the AMR resistors 210 and 220 may be further set to be the opposite directions D2 and D1, respectively. After the magnetized directions of the AMR resistors 210 and 220 are completely adjusted, the current sources IS1 and IS2 of the current generator 230 again provide the currents I1 and I2 in the direction D1 to flow through the AMR resistors 210 and 220. The operational amplifiers OP1 and OP2 can then generate the first detection voltage V1' and the second detection voltage V2' according to the voltage differences between the two terminals of the AMR resistors 210 and 220, and the arithmetic operation device 241 performs a subtraction operation on the first and second detection voltages V1' and V2' to obtain the second magnetic field detection result Vo.

Figure 5:
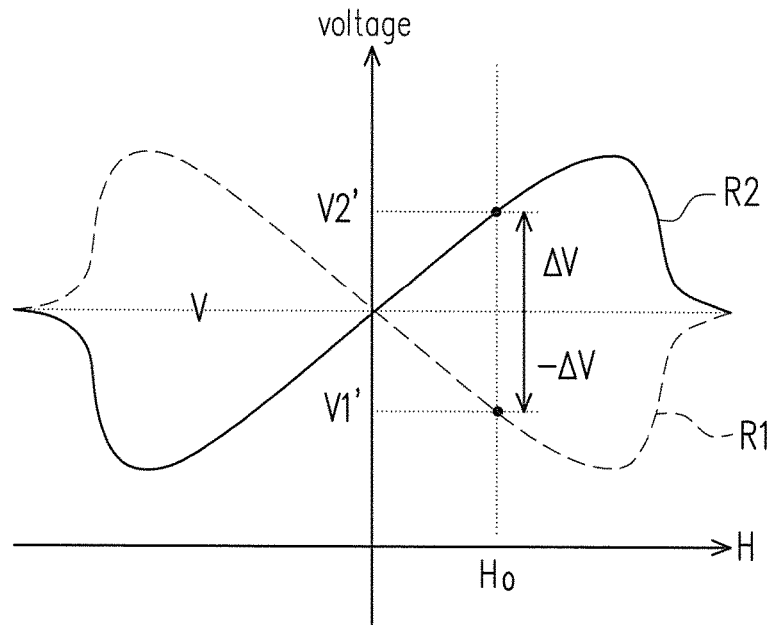
FIG. 5 is a diagram illustrating waveforms of a magnetic field detection result at a second stage according to an embodiment of the invention.

Please refer to FIG. 4 and FIG. 5. FIG. 5 is a diagram illustrating waveforms of a magnetic field detection result at a second stage according to an embodiment of the invention. In FIG. 5, the vertical axis is the voltage of the first magnetic field detection result Vo, and the horizontal axis is the intensity of the tested magnetic field H. If the intensity of the tested magnetic field H is within a fixed range, there is linear relationship between the tested magnetic field H and the resistances R1 and R2 respectively provided by the AMR resistor 210 and 220. Different from those depicted in FIG. 3, in FIG. 5, the resistance R1 is negatively correlated to the tested magnetic field H, and the resistance R2 is positively correlated to the tested magnetic field H.

As shown in FIG. 5, if the tested magnetic field H is equal to H0, the first detection voltage V1' generated by the operational amplifier OP1 is equal to $V+\Delta V$, and the second detection voltage V2' generated by the operational amplifier OP1 is equal to $V-\Delta V$. Here, V is a base voltage. The second magnetic field detection result Vo' is then obtained by subtracting the second detection voltage V2' from the first detection voltage V1', i.e., $Vo'=V+\Delta V-(V-\Delta V)=-2\times\Delta V$. The arithmetic operation device 240 further performs a subtraction operation on the first magnetic field detection result Vo and the second magnetic field detection result Vo' to obtain a third magnetic field detection result as $4\times\Delta V$.

Through the subtraction operation on the first magnetic field detection result Vo and the second magnetic field detection result Vo', the impact resulting from the DC offset of the operational amplifiers OP1 and OP2 can be effectively compensated, and the accuracy of the magnetic field detection result can be further enhanced.

Note that the connection relationships between the positive and negative input terminals of the operational amplifiers OP1 and OP2 and the terminals of the AMR resistors 210 and 220 can be modified. For instance, the positive and negative input terminals of the operational amplifiers OP1 and OP2 as respectively shown in FIG. 2 and FIG. 4 can be exchanged, and the arithmetic operation device 241 can be correspondingly replaced by an adder. As such, the magnetic field sensing apparatus 200 can still generate the same magnetic field detection result. That is to say, people having ordinary skill in the art are able to modify the connection relationships between the input terminals of the operational amplifiers OP1 and OP2 and the terminals of the AMR resistors 210 and 220 as well as the arithmetic operation performed by the arithmetic operation device 241 according to the aforesaid principles and enable the present embodiment.

Figure 6:
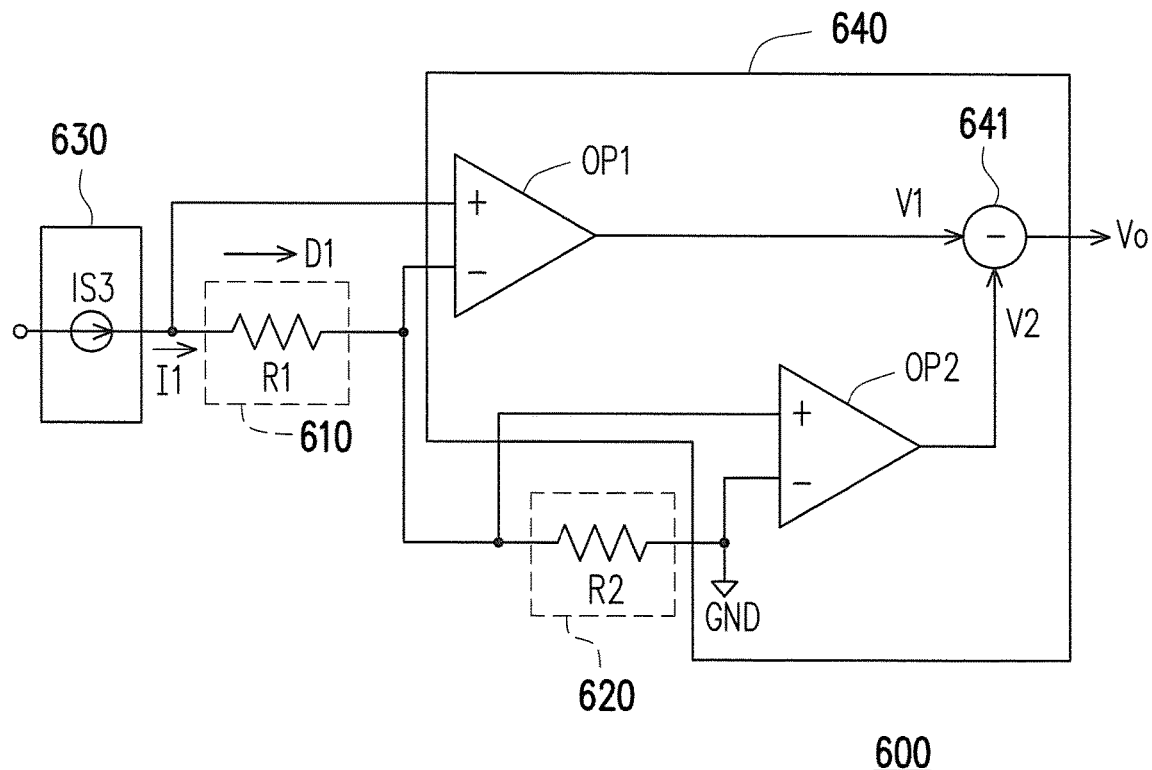
FIG. 6 is a schematic diagram illustrating a magnetic field sensing apparatus according to yet another embodiment of the invention.

Please refer to FIG. 6, which is a schematic diagram illustrating a magnetic field sensing apparatus according to yet another embodiment of the invention. The magnetic field sensing apparatus 600 includes AMR resistors 610 and 620, a current generator 630, and an arithmetic device 640. The arithmetic device 640 further includes operational amplifiers OP1 and OP2 and the arithmetic operation device 641. Different from the AMR resistors provided in the previous embodiment, the AMR resistors 610 and 620 described in the present embodiment are serially coupled to each other. Here, the first terminal of the AMR resistor 610 is coupled to the current generator 630 and the positive input terminal of the operational amplifier OP1, and the second terminal of the AMR resistor 610 is coupled to the negative input terminal of the operational amplifier OP1 and the first terminal of the AMR resistor 620. Besides, the first terminal of the AMR resistor 620 is coupled to the positive input terminal of the operational amplifier OP2, and the second terminal of the AMR resistor 620 is coupled to the negative input terminal of the operational amplifier OP2 and the reference ground terminal GND.

Since the AMR resistors 610 and 620 are serially coupled to each other, the current generator 630 can generate the current I1 merely through one single current source IS3. The current generator 630 transmits the current I1 in the direction D1 to sequentially flow through the AMR resistors 610 and 620. In view of the present embodiment, the magnetized directions of the AMR resistors 610 and 620 are set to be opposite to each other, and the aforesaid one-stage or two-stage magnetic field detection method is performed. As such, the magnetic field sensing apparatus 600 provided in the present embodiment may obtain the magnetic field detection result Vo through performing the arithmetic operation by the arithmetic operation device 641.

Figure 7A:
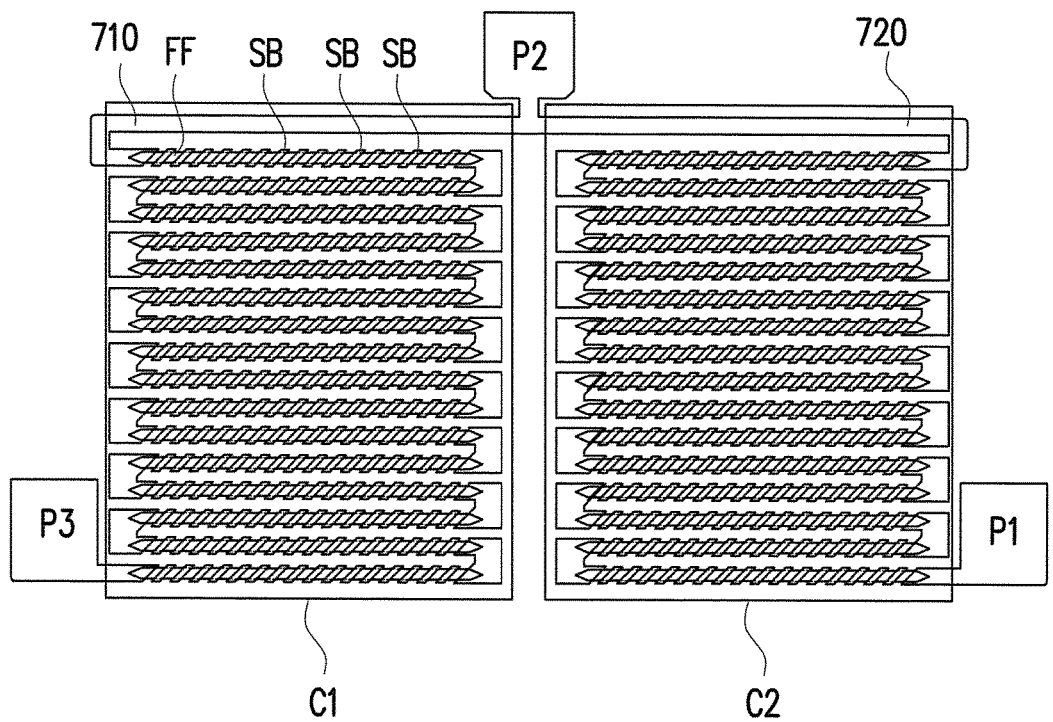
FIG. 7A and FIG. 7B illustrate a layout method of AMR resistors in different embodiments of the invention.
Figure 7B:
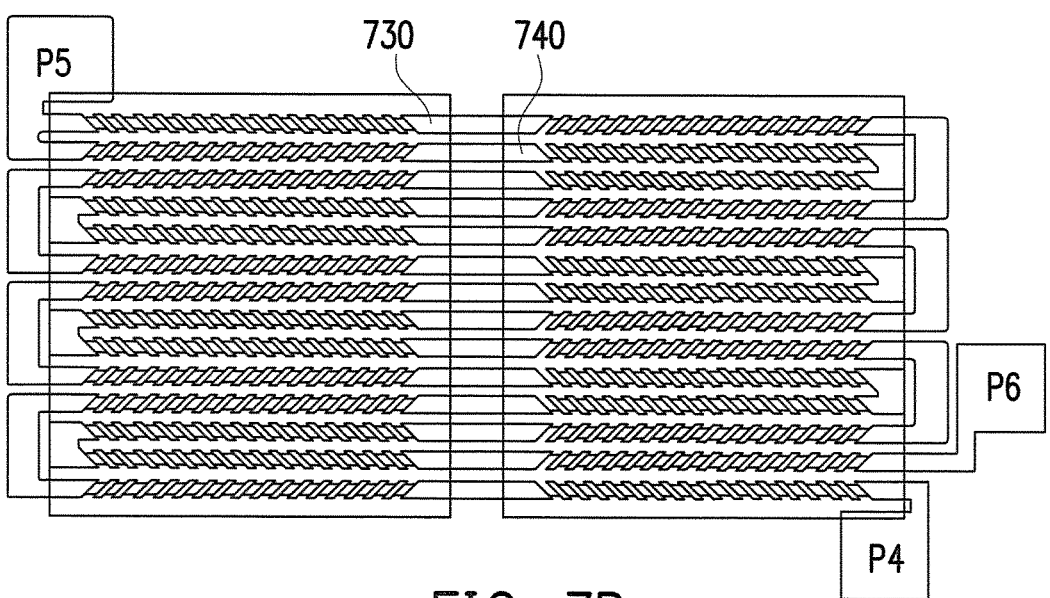

Please refer to FIG. 7A and FIG. 7B. FIG. 7A and FIG. 7B illustrate a layout method of AMR resistors in different embodiments of the invention. Here, the AMR resistors 710 and 720 may each have a barber-pole-shaped structure, i.e., electrical shorting bars SB tilting at 45 degrees with respect to the extension direction of the AMR resistors 710 and 720 are arranged on the surface of the AMR resistors 710 and 720. The electrical shorting bars are spaced from each other and are arranged in parallel on a ferromagnetic film FF. The ferromagnetic film FF constitutes the main body of the AMR resistors 710 and 720, and the extension direction of the ferromagnetic film FF is the extension direction of the AMR resistors 710 and 720. Two opposite terminals of the ferromagnetic film FF may be sharp terminals.

In FIG. 7A, the AMR resistors 710 and 120 are spaced from each other. The AMR resistor 710 is located on a magnetized direction setting device C1, and the AMR resistor 720 is located on a magnetized direction setting device C2. In addition, the AMR resistor 710 is coupled between terminals P2, and the AMR resistor 720 is coupled between terminals P1 and P2. The AMR resistors 710 and 720 shown in FIG. 7A may be respectively applied as the AMR resistors 210 and 220 provided in FIG. 2. The terminal P1 is coupled to the positive input terminal of the operational amplifier OP2 and receives the current I2, the terminal P3 is coupled to the positive input terminal of the operational amplifier OP1 and receives the current I1, and the terminal P2 is coupled to the reference ground germinal GND and the negative input terminals of the operational amplifiers OP1 and OP2. Besides, the AMR resistors 710 and 720 shown in FIG. 7A may be respectively applied as the AMR resistors 610 and 620 provided in FIG. 6. The terminal P2 is coupled to the negative input terminal of the operational amplifier OP1 and the positive input terminal of the operational amplifier OP2, the terminal P3 is coupled to the positive input terminal of the operational amplifier OP1 and receives the current I1, and the terminal P1 is coupled to the reference ground germinal GND and the negative input terminal of the operational amplifier OP2. The magnetized direction setting devices C1 and C2 are, for instance, coils, conductive wires, or conductors. Currents may be transmitted to the magnetized direction setting devices C1 and C2 to generate two magnetic fields that are parallel to the extension direction of the ferromagnetic film FF, pass through the ferromagnetic film FF, and have opposite directions. Thereby, the magnetized direction setting devices C1 and C2 may set the magnetized directions of the AMR resistors 710 and 720 as the directions D1 and D2, respectively.

In FIG. 7B, the AMR resistors 730 and 740 are alternately arranged. One portion of the AMR resistor 730 and one portion of the AMR resistor 740 are alternately arranged in the magnetized direction setting device C1, and the other portion of the AMR resistor 730 and the other portion of the AMR resistor 740 are alternately arranged in the magnetized direction setting device C2. The AMR resistor 730 is coupled between the terminals P5 and P6, and the AMR resistor 740 is coupled between the terminals P5 and P4. Note that the portion of the AMR resistor 730 and the portion of the AMR resistor 740 which are located in the same magnetized direction setting device have the electrical shorting bars whose directions are complementary, and the portions of the AMR resistor 730 (or the portions of the AMR resistor 740) which are located in different magnetized direction setting devices also have the electrical shorting bars whose directions are complementary.

The AMR resistors 730 and 740 shown in FIG. 7B can also be applied in the magnetic field sensing apparatuses 200 and 600 depicted in FIG. 2 and FIG. 6. When the AMR resistors 710 and 720 are applied in the magnetic field sensing apparatus 200, the terminal P4 is coupled to the positive input terminal of the operational amplifier OP2 and receives the current I2, the terminal P6 is coupled to the positive input terminal of the operational amplifier OP1 and receives the current I1, and the terminal P5 is coupled to the reference ground germinal GND and the negative input terminals of the operational amplifiers OP1 and OP2. When the AMR resistors 710 and 720 are applied in the magnetic field sensing apparatus 600, the terminal P5 is coupled to the negative input terminal of the operational amplifier OP1, the terminal P6 is coupled to the positive input terminal of the operational amplifier OP1 and receives the current I1, and the terminal P4 is coupled to the reference ground germinal GND and the negative input terminal of the operational amplifier OP2.

Figure 8:
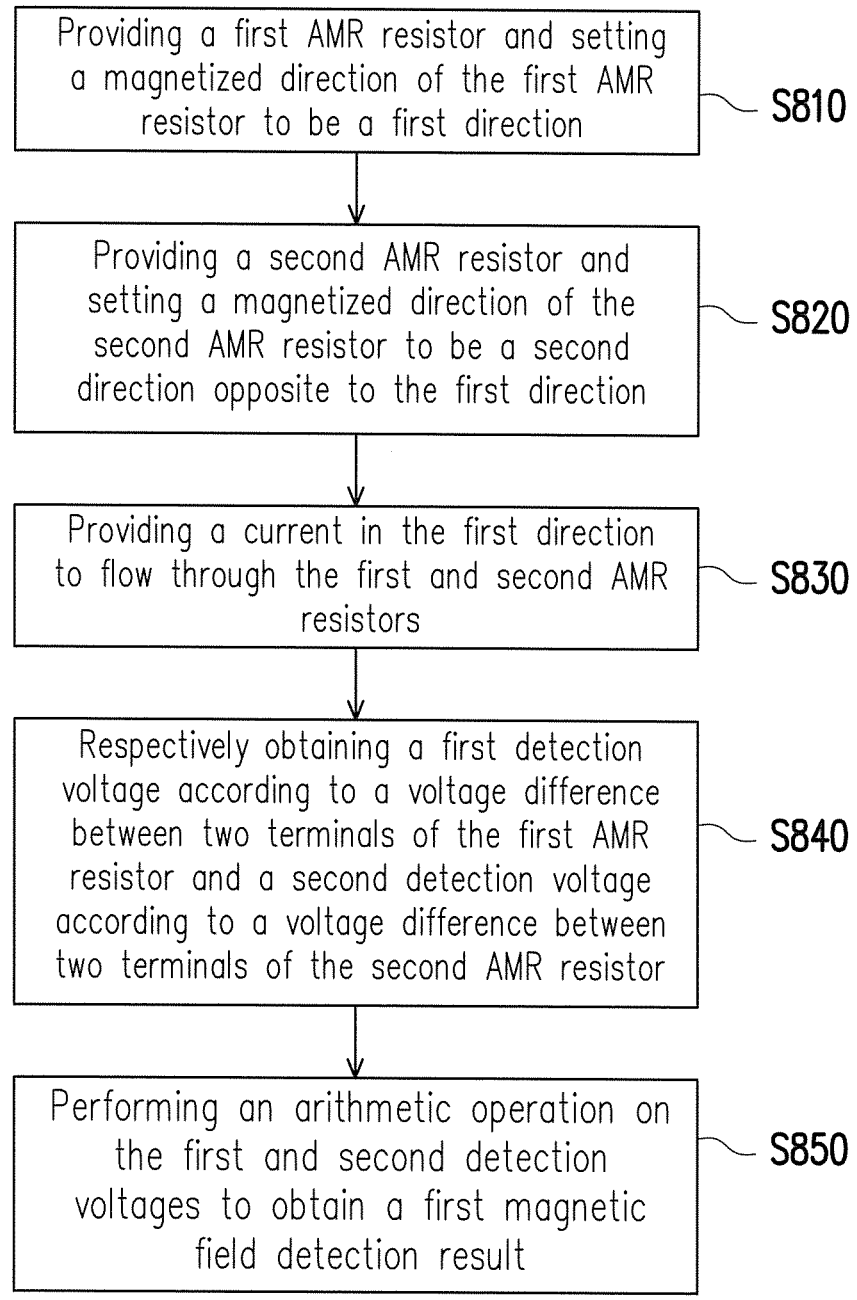
FIG. 8 is a flowchart illustrating a magnetic field sensing method according to an embodiment of the invention.

Please refer to FIG. 8. FIG. 8 is a flowchart of a magnetic field detection method according to an embodiment of the invention. In step S810, a first AMR resistor is provided, and a magnetized direction of the first AMR resistor is set to be a first direction. In step S820, a second AMR resistor is provided, and a magnetized direction of the second AMR resistor is set to be a second direction that is opposite to the first direction. In step S830, a current is provided in the first direction to flow through the first and second AMR resistors. In step S840, a first detection voltage is obtained according to a voltage difference between two terminals of the first AMR resistor, and a second detection voltage is obtained according to a voltage difference between two terminals of the second AMR resistor. In step S850, an arithmetic operation is performed on the first and second detection voltages to obtain a first magnetic field detection result.

Details of the above steps have been specified in the foregoing embodiments of the invention and thus are not repeated hereinafter.

With reference to FIG. 7A and FIG. 7B, the magnetized directions of the AMR resistors 710 and 720 are set as the directions D1 and D2 opposite to each other, for instance; however, in another embodiment of the invention, the direction of the electrical shorting bars SB in the AMR resistor 720 shown in FIG. 7A may be changed to the direction of the electrical shorting bars SB in the AMR resistor 740 located on the right side in FIG. 7B (i.e., the direction shown in FIG. 7A differs from the direction shown in FIG. 7B by 90 degrees, whereas the included angle between the extension direction of the electrical shorting bars SB and the extension direction of the ferromagnetic film FF remains at 45 degrees). As to the properties of the AMR resistors, if the external magnetic field remains unchanged, and the electrical shorting bars are rotated by 90 degrees, the resistance of the AMR resistor is changed from +ΔR to −ΔR or from −ΔR to +ΔR, and ΔR corresponds the value of the external magnetic field component perpendicular to the ferromagnetic film FF; if the direction of the magnetic field is reversed, said scenario is also applicable. However, the aforesaid scenario is not applicable if the direction of the current of the ferromagnetic film FF is reversed; instead, the directions of the varied resistances of the AMR resistors remains unchanged. Hence, in the embodiment of the invention, the direction of the electrical shorting bars SB in the AMR resistor 720 shown in FIG. 7A is changed to the direction of the electrical shorting bars SB in the AMR resistor 740 located on the right side in FIG. 7B (i.e., the direction of the electrical shorting bars SB in the AMR resistor 720 is perpendicular to the direction of the electrical shorting bars SB in the AMR resistor 740). At this time, the magnetic field setting direction (the direction D1) of the AMR resistor 710 may be set as the magnetic field setting direction (the direction D2) of the AMR resistor 720, i.e., both the directions D1 and D2 face the left side or the right side in FIG. 7A. Thereby, the directions of the varied resistances of the AMR resistors 710 and 720 corresponding to the tested magnetic field H are opposite, while the values of the varied resistances are substantially the same, i.e., the resistances are changed by ΔR and −ΔR. In yet another embodiment, the magnetic field setting directions of the AMR resistors 710 and 720 may be reversed at the next time point, e.g., both the directions D1 and D2 facing the left side now face the right side, or both the directions D1 and D2 facing the right side now face the left side.

To sum up, the first and second AMR resistors are provided in pairs. The first and second AMR resistors have the same magnetized direction or opposite magnetized directions. When the resistance of the first AMR resistor increases according to the tested magnetic field, the resistance of the second AMR resistor correspondingly decreases, and when the resistance of the first AMR resistor decreases according to the tested magnetic field, the resistance of the second AMR resistor correspondingly increases. Besides, the voltage differences generated by the first and second AMR resistors which receive the same current are detected to calculate the magnetic field detection result. As such, only the first and second AMR resistors in pairs are required to complete the magnetic field sensing action, and therefore the circuit layout area of the magnetic field sensing apparatus as well as the production costs can be effectively reduced. In addition, the arithmetic operation performed on the voltage differences of the AMR resistors effectively reduces the impact of the ambient noise on the detection results, and the DC offset of the circuit device and the skew electrical parameters resulting from the temperature may also be compensated, so as to enhance the accuracy of the detection results.

It will be apparent to those skilled in the art that various modifications and variations can be made to the disclosed embodiments without departing from the scope or spirit of the invention. In view of the foregoing, it should be mentioned that the invention covers modifications and variations of this disclosure provided that they fall within the scope of the following claims and their equivalents.

What is claimed is:

1. A magnetic field sensing apparatus comprising:
a first anisotropic magneto-resistive resistor, a magnetized direction of the first anisotropic magneto-resistive resistor being set to be a first direction;
a second anisotropic magneto-resistive resistor, a magnetized direction of the second anisotropic magneto-resistive resistor being set to be a second direction opposite to the first direction, wherein when a resistance of the first anisotropic magneto-resistive resistor increases according to a magnetic field to be tested, a resistance of the second anisotropic magneto-resistive resistor correspondingly decreases, and when the resistance of the first anisotropic magneto-resistive resistor decreases according to the magnetic field to be tested, the resistance of the second anisotropic magneto-resistive resistor correspondingly increases;
a current generator coupled to the first anisotropic magneto-resistive resistor and the second anisotropic magneto-resistive resistor, the current generator providing a current in a direction parallel to the first direction to flow through the first and second anisotropic magneto-resistive resistors; and
an arithmetic device coupled to the first anisotropic magneto-resistive resistor, the second anisotropic magneto-resistive resistor, and the current generator, wherein the arithmetic device obtains a first detection voltage according to a voltage difference between two terminals of the first anisotropic magneto-resistive resistor, obtains a second detection voltage according to a voltage difference between two terminals of the second anisotropic magneto-resistive resistor, and performs an arithmetic operation on the first and second detection voltages to obtain a first magnetic field detection result.

2. The magnetic field sensing apparatus according to claim 1, wherein the arithmetic device comprises:
a first operational amplifier, a first input terminal of the first operational amplifier being coupled to a first terminal of the two terminals of the first anisotropic magneto-resistive resistor, a second terminal of the first operational amplifier being coupled to a second terminal of the two terminals of the first anisotropic magneto-resistive resistor and a reference ground terminal, an output terminal of the first operational amplifier generating the first detection voltage;
a second operational amplifier, a first input terminal of the second operational amplifier being coupled to a first terminal of the two terminals of the second anisotropic magneto-resistive resistor, a second terminal of the second operational amplifier being coupled to a second terminal of the two terminals of the second anisotropic magneto-resistive resistor and the reference ground terminal, an output terminal of the second operational amplifier generating the second detection voltage; and
an arithmetic operation device coupled to the output terminal of the first operational amplifier and the output terminal of the second operational amplifier, such that the first detection voltage and the second detection voltage are applied to perform the arithmetic operation and obtain the first magnetic field detection result.

3. The magnetic field sensing apparatus according to claim 2, wherein the arithmetic operation device is a subtractor, and the arithmetic operation is a subtraction operation.

4. The magnetic field sensing apparatus according to claim 2, wherein the current generator comprises:
a first current source coupled to the first terminal of the first anisotropic magneto-resistive resistor, the first current source providing a first current in the direction parallel to the first direction to flow through the first anisotropic magneto-resistive resistor; and a second current source coupled to the first terminal of the second anisotropic magneto-resistive resistor, the second current source providing a second current in the direction parallel to the first direction to flow through the second anisotropic magneto-resistive resistor.

5. The magnetic field sensing apparatus according to claim 1, wherein the arithmetic device comprises:
a first operational amplifier, a first input terminal of the first operational amplifier being coupled to a first terminal of the two terminals of the first anisotropic magneto-resistive resistor, a second terminal of the first operational amplifier being coupled to a second terminal of the two terminals of the first anisotropic magneto-resistive resistor and a first terminal of the two terminals of the second anisotropic magneto-resistive resistor, an output terminal of the first operational amplifier generating the first detection voltage;
a second operational amplifier, a first input terminal of the second operational amplifier being coupled to the first terminal of the two terminals of the second anisotropic magneto-resistive resistor, a second terminal of the second operational amplifier being coupled to a second terminal of the two terminals of the second anisotropic magneto-resistive resistor and a reference ground terminal, an output terminal of the second operational amplifier generating the second detection voltage; and
an arithmetic operation device coupled to the output terminal of the first operational amplifier and the output terminal of the second operational amplifier, such that the first detection voltage and the second detection voltage are applied to perform the arithmetic operation and obtain the first magnetic field detection result.

6. The magnetic field sensing apparatus according to claim 5, wherein the current generator provides a first current to the first terminal of the first anisotropic magneto-resistive resistor and enables the first current to sequentially flow through the first and second anisotropic magneto-resistive resistors in the direction parallel to the first direction.

7. The magnetic field sensing apparatus according to claim 1, wherein after the first magnetic field detection result is generated, the magnetized direction of the first anisotropic magneto-resistive resistor is converted into an opposite direction of the first direction, the magnetized direction of the second anisotropic magneto-resistive resistor is converted into an opposite direction of the second direction, and the arithmetic device further obtains a third detection voltage according to the voltage difference between the two terminals of the first anisotropic magneto-resistive resistor, obtains a fourth detection voltage according to the voltage difference between the two terminals of the second anisotropic magneto-resistive resistor, and performs an arithmetic operation on the third and fourth detection voltages to obtain a second magnetic field detection result.

8. The magnetic field sensing apparatus according to claim 7, wherein the arithmetic device further performs the arithmetic operation on the first and second magnetic field detection results to obtain a third magnetic field detection result.

9. The magnetic field sensing apparatus according to claim 1, wherein the first anisotropic magneto-resistive resistor and the second anisotropic magneto-resistive resistor are located on one substrate.

10. The magnetic field sensing apparatus according to claim 1, further comprising:
a plurality of magnetized direction setting devices respectively located around the first anisotropic magneto-resistive resistor and the second anisotropic magneto-resistive resistor to set up the magnetized directions of the first anisotropic magneto-resistive resistor and of the second anisotropic magneto-resistive resistor.

11. A magnetic field detection method comprising:
providing a first anisotropic magneto-resistive resistor and setting a magnetized direction of the first anisotropic magneto-resistive resistor to be a first direction;
providing a second anisotropic magneto-resistive resistor and setting a magnetized direction of the second anisotropic magneto-resistive resistor to be a second direction opposite to the first direction, wherein when a resistance of the first anisotropic magneto-resistive resistor increases according to a magnetic field to be tested, a resistance of the second anisotropic magneto-resistive resistor correspondingly decreases, and when the resistance of the first anisotropic magneto-resistive resistor decreases according to the magnetic field to be tested, the resistance of the second anisotropic magneto-resistive resistor correspondingly increases;
providing a current in a direction parallel to the first direction to flow through the first and second anisotropic magneto-resistive resistors;
respectively obtaining a first detection voltage according to a voltage difference between two terminals of the first anisotropic magneto-resistive resistor and obtaining a second detection voltage according to a voltage difference between two terminals of the second anisotropic magneto-resistive resistor; and
performing an arithmetic operation on the first and second detection voltages to obtain a first magnetic field detection result.

12. The magnetic field detection method according to claim 11, wherein the step of respectively obtaining the first detection voltage according to the voltage difference between the two terminals of the first anisotropic magneto-resistive resistor and obtaining the second detection voltage according to the voltage difference between the two terminals of the second anisotropic magneto-resistive resistor comprises:
providing a first operational amplifier to receive voltages at the two terminals of the first anisotropic magneto-resistive resistor and generating the first detection voltage according to the voltage difference between the two terminals of the first anisotropic magneto-resistive resistor; and
providing a second operational amplifier to receive voltages at the two terminals of the second anisotropic magneto-resistive resistor and generating the second detection voltage according to the voltage difference between the two terminals of the second anisotropic magneto-resistive resistor.

13. The magnetic field detection method according to claim 11, wherein a method of providing the current in the direction parallel to the first direction to flow through the first and second anisotropic magneto-resistive resistors comprises:
providing a first current in the direction parallel to the first direction to flow through the first anisotropic magneto-resistive resistor; and
providing a second current in the direction parallel to the first direction to flow through the second anisotropic magneto-resistive resistor.

14. The magnetic field detection method according to claim 11, wherein a method of providing the current in the direction parallel to the first direction to flow through the first and second anisotropic magneto-resistive resistors comprises:

providing a first current in the direction parallel to the first direction to sequentially flow through the first and second anisotropic magneto-resistive resistors.

15. The magnetic field detection method according to claim 11, after the first magnetic field detection result is generated, the method further comprising:

converting the magnetized direction of the first anisotropic magneto-resistive resistor into an opposite direction of the first direction;

converting the magnetized direction of the second anisotropic magneto-resistive resistor into an opposite direction of the second direction;

providing a current in a direction parallel to the first direction to flow through the first and second anisotropic magneto-resistive resistors;

respectively obtaining a third detection voltage according to the voltage difference between the two terminals of the first anisotropic magneto-resistive resistor and obtaining a fourth detection voltage according to the voltage difference between the two terminals of the second anisotropic magneto-resistive resistor; and performing an arithmetic operation on the third and fourth detection voltages to obtain a second magnetic field detection result.

16. The magnetic field detection method according to claim 15, further comprising:

performing the arithmetic operation on the first and second magnetic field detection results to obtain a third magnetic field detection result.

17. The magnetic field detection method according to claim 11, wherein the first anisotropic magneto-resistive resistor and the second anisotropic magneto-resistive resistor are located on one substrate.

* * * * *